US008430958B2

(12) United States Patent
D'Evelyn

(10) Patent No.: US 8,430,958 B2
(45) Date of Patent: Apr. 30, 2013

(54) APPARATUS AND METHOD FOR SEED CRYSTAL UTILIZATION IN LARGE-SCALE MANUFACTURING OF GALLIUM NITRIDE

(75) Inventor: Mark P. D'Evelyn, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 889 days.

(21) Appl. No.: 12/534,843

(22) Filed: Aug. 3, 2009

(65) Prior Publication Data

US 2010/0031872 A1    Feb. 11, 2010

Related U.S. Application Data

(60) Provisional application No. 61/087,135, filed on Aug. 7, 2008.

(51) Int. Cl.
| | |
|---|---|
| *C30B 11/00* | (2006.01) |
| *C30B 7/00* | (2006.01) |
| *C30B 21/02* | (2006.01) |
| *C30B 28/06* | (2006.01) |
| *C30B 35/00* | (2006.01) |

(52) U.S. Cl.
USPC .............. 117/68; 117/11; 117/71; 117/200

(58) Field of Classification Search ............ 117/68, 117/11, 71, 200
See application file for complete search history.

(56) References Cited

U.S. PATENT DOCUMENTS

| | | |
|---|---|---|
| 3,245,760 A | 4/1966 | Sawyer |
| 3,303,053 A | 2/1967 | Strong et al. |
| 3,335,084 A | 8/1967 | Hall |
| 4,030,966 A | 6/1977 | Hornig et al. |
| 4,430,051 A | 2/1984 | Von Platen |
| 5,868,837 A | 2/1999 | DiSalvo et al. |
| 6,090,202 A | 7/2000 | Klipov |
| 6,129,900 A | 10/2000 | Satoh et al. |
| 6,152,977 A | 11/2000 | D'Evelyn |
| 6,350,191 B1 | 2/2002 | D'Evelyn et al. |
| 6,372,002 B1 | 4/2002 | D'Evelyn et al. |
| 6,398,867 B1 | 6/2002 | D'Evelyn et al. |
| 6,406,776 B1 | 6/2002 | D'Evelyn |
| 6,455,877 B1 | 9/2002 | Ogawa et al. |
| 6,475,254 B1 | 11/2002 | Saak et al. |

(Continued)

FOREIGN PATENT DOCUMENTS

| | | |
|---|---|---|
| JP | 2005-289797 A2 | 10/2005 |
| JP | 2007-039321 A | 2/2007 |

(Continued)

OTHER PUBLICATIONS

Lide et al., 'Thermal Conductivity of Ceramics and Other Insulating Materials,' CRC Handbook of Chemistry and Physics, 91st Edition, 2010-2011, pp. 12-203 and 12-204.

(Continued)

*Primary Examiner* — James McDonough
(74) *Attorney, Agent, or Firm* — Kilpatrick Townsend & Stockton LLP

(57) ABSTRACT

An apparatus and associated method for large-scale manufacturing of gallium nitride. The apparatus comprises a large diameter autoclave or internally-heated high pressure vessel, a seed rack, and a raw material basket. Methods include effective means for utilization of seed crystals. The apparatus and methods are scalable up to very large volumes and are cost effective.

21 Claims, 6 Drawing Sheets

U.S. PATENT DOCUMENTS

| | | |
|---|---|---|
| 6,533,874 B1 | 3/2003 | Vaudo et al. |
| 6,541,115 B2 | 4/2003 | Pender et al. |
| 6,596,040 B2 | 7/2003 | Saak et al. |
| 6,596,079 B1 | 7/2003 | Vaudo et al. |
| 6,639,925 B2 | 10/2003 | Niwa et al. |
| 6,656,615 B2 | 12/2003 | Dwilinski et al. |
| 6,764,297 B2 | 7/2004 | Godwin et al. |
| 6,765,240 B2 | 7/2004 | Tischler et al. |
| 6,784,463 B2* | 8/2004 | Camras et al. .................. 257/99 |
| 6,787,814 B2 | 9/2004 | Udagawa |
| 6,806,508 B2 | 10/2004 | D'Evelyn et al. |
| 6,858,882 B2 | 2/2005 | Tsuda et al. |
| 6,861,130 B2 | 3/2005 | D'Evelyn et al. |
| 6,936,488 B2 | 8/2005 | D'Evelyn et al. |
| 6,955,719 B2 | 10/2005 | Dmitriev et al. |
| 7,001,577 B2* | 2/2006 | Zimmerman et al. ........ 423/290 |
| 7,009,199 B2 | 3/2006 | Hall et al. |
| 7,009,215 B2 | 3/2006 | D'Evelyn et al. |
| 7,012,279 B2 | 3/2006 | Wierer, Jr. et al. |
| 7,026,755 B2 | 4/2006 | Setlur et al. |
| 7,026,756 B2* | 4/2006 | Shimizu et al. ............... 313/503 |
| 7,033,858 B2 | 4/2006 | Chai et al. |
| 7,053,413 B2 | 5/2006 | D'Evelyn et al. |
| 7,063,741 B2 | 6/2006 | D'Evelyn et al. |
| 7,067,407 B2 | 6/2006 | Kostamo et al. |
| 7,078,731 B2 | 7/2006 | D'Evelyn et al. |
| 7,098,487 B2 | 8/2006 | D'Evelyn et al. |
| 7,101,433 B2 | 9/2006 | D'Evelyn et al. |
| 7,102,158 B2 | 9/2006 | Tysoe et al. |
| 7,105,865 B2 | 9/2006 | Nakahata et al. |
| 7,112,829 B2 | 9/2006 | Picard et al. |
| 7,119,372 B2 | 10/2006 | Stokes et al. |
| 7,122,827 B2 | 10/2006 | Alizadeh et al. |
| 7,125,453 B2 | 10/2006 | D'Evelyn et al. |
| 7,160,388 B2 | 1/2007 | Dwilinski et al. |
| 7,160,531 B1 | 1/2007 | Jacques et al. |
| 7,175,704 B2 | 2/2007 | D'Evelyn et al. |
| 7,198,671 B2* | 4/2007 | Ueda .............................. 117/84 |
| 7,208,393 B2 | 4/2007 | Haskell et al. |
| 7,220,658 B2 | 5/2007 | Haskell et al. |
| 7,252,712 B2 | 8/2007 | Dwilinski et al. |
| 7,285,801 B2 | 10/2007 | Eliashevich et al. |
| 7,291,544 B2 | 11/2007 | D'Evelyn et al. |
| 7,316,746 B2 | 1/2008 | D'Evelyn et al. |
| 7,329,371 B2 | 2/2008 | Setlur et al. |
| 7,335,262 B2 | 2/2008 | Dwilinski et al. |
| 7,338,828 B2 | 3/2008 | Imer et al. |
| 7,358,542 B2 | 4/2008 | Radkov et al. |
| 7,364,619 B2 | 4/2008 | Dwilinski et al. |
| 7,368,015 B2 | 5/2008 | D'Evelyn et al. |
| 7,381,391 B2 | 6/2008 | Spencer et al. |
| 7,420,261 B2 | 9/2008 | Dwilinski et al. |
| 7,572,425 B2 | 8/2009 | McNulty et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Giddings et al. |
| 7,759,710 B1 | 7/2010 | Chiu et al. |
| 7,871,839 B2 | 1/2011 | Lee et al. |
| 7,976,630 B2 | 7/2011 | Poblenz et al. |
| 8,048,225 B2 | 11/2011 | Poblenz et al. |
| 8,097,081 B2 | 1/2012 | D'Evelyn |
| 8,148,801 B2 | 4/2012 | D'Evelyn |
| 8,188,504 B2 | 5/2012 | Lee |
| 8,198,643 B2 | 6/2012 | Lee et al. |
| 8,207,548 B2 | 6/2012 | Nagai |
| 8,284,810 B1 | 10/2012 | Sharma et al. |
| 8,299,473 B1 | 10/2012 | D'Evelyn et al. |
| 8,303,710 B2 | 11/2012 | D'Evelyn |
| 8,306,081 B1 | 11/2012 | Schmidt et al. |
| 8,323,405 B2 | 12/2012 | D'Evelyn |
| 8,329,511 B2 | 12/2012 | D'Evelyn |
| 2001/0009134 A1 | 7/2001 | Kim et al. |
| 2001/0011935 A1 | 8/2001 | Lee et al. |
| 2001/0048114 A1 | 12/2001 | Morita et al. |
| 2002/0070416 A1 | 6/2002 | Morse et al. |
| 2002/0105986 A1 | 8/2002 | Yamasaki |
| 2002/0182768 A1 | 12/2002 | Morse et al. |
| 2002/0189532 A1 | 12/2002 | Motoki et al. |
| 2003/0027014 A1 | 2/2003 | Johnson et al. |
| 2003/0140845 A1 | 7/2003 | D'Evelyn et al. |
| 2003/0145784 A1 | 8/2003 | Thompson et al. |
| 2003/0164507 A1 | 9/2003 | Edmond et al. |
| 2003/0183155 A1 | 10/2003 | D'Evelyn et al. |
| 2003/0209191 A1 | 11/2003 | Purdy |
| 2003/0232512 A1 | 12/2003 | Dickinson et al. |
| 2004/0000266 A1 | 1/2004 | D'Evelyn et al. |
| 2004/0023427 A1 | 2/2004 | Chua et al. |
| 2004/0104391 A1 | 6/2004 | Maeda et al. |
| 2004/0124435 A1 | 7/2004 | D'Evelyn et al. |
| 2004/0161222 A1 | 8/2004 | Niida et al. |
| 2004/0222357 A1 | 11/2004 | King et al. |
| 2005/0087753 A1 | 4/2005 | D'Evelyn et al. |
| 2005/0098095 A1 | 5/2005 | D'Evelyn et al. |
| 2005/0109240 A1 | 5/2005 | Maeta et al. |
| 2005/0121679 A1 | 6/2005 | Nagahama et al. |
| 2005/0128469 A1 | 6/2005 | Hall et al. |
| 2005/0152820 A1 | 7/2005 | D'Evelyn et al. |
| 2005/0167680 A1 | 8/2005 | Shei et al. |
| 2005/0191773 A1 | 9/2005 | Suzuki et al. |
| 2005/0205215 A1 | 9/2005 | Giddings et al. |
| 2005/0263791 A1 | 12/2005 | Yanagihara et al. |
| 2006/0030738 A1 | 2/2006 | Vanmaele et al. |
| 2006/0032428 A1 | 2/2006 | Dwilinski et al. |
| 2006/0037529 A1 | 2/2006 | D'Evelyn et al. |
| 2006/0037530 A1 | 2/2006 | Dwilinski et al. |
| 2006/0038193 A1 | 2/2006 | Wu et al. |
| 2006/0048699 A1* | 3/2006 | D'Evelyn et al. ............... 117/68 |
| 2006/0096521 A1 | 5/2006 | D'Evelyn et al. |
| 2006/0118799 A1 | 6/2006 | D'Evelyn et al. |
| 2006/0163589 A1 | 7/2006 | Fan et al. |
| 2006/0169993 A1 | 8/2006 | Fan et al. |
| 2006/0177362 A1 | 8/2006 | D'Evelyn et al. |
| 2006/0207497 A1 | 9/2006 | D'Evelyn et al. |
| 2006/0213429 A1 | 9/2006 | Motoki et al. |
| 2006/0214287 A1 | 9/2006 | Ogihara et al. |
| 2006/0228870 A1 | 10/2006 | Oshima |
| 2006/0246687 A1 | 11/2006 | Kaiser et al. |
| 2006/0255343 A1 | 11/2006 | Ogihara et al. |
| 2006/0289386 A1 | 12/2006 | Tysoe et al. |
| 2007/0015345 A1 | 1/2007 | Baker et al. |
| 2007/0057337 A1 | 3/2007 | Kano et al. |
| 2007/0077674 A1 | 4/2007 | Okuyama et al. |
| 2007/0096239 A1 | 5/2007 | Cao et al. |
| 2007/0105351 A1 | 5/2007 | Motoki et al. |
| 2007/0114569 A1 | 5/2007 | Wu et al. |
| 2007/0121690 A1 | 5/2007 | Fujii et al. |
| 2007/0131967 A1 | 6/2007 | Kawaguchi et al. |
| 2007/0141819 A1 | 6/2007 | Park |
| 2007/0142204 A1 | 6/2007 | Park et al. |
| 2007/0151509 A1 | 7/2007 | Park |
| 2007/0158785 A1* | 7/2007 | D'Evelyn et al. ............. 257/615 |
| 2007/0164292 A1 | 7/2007 | Okuyama |
| 2007/0166853 A1 | 7/2007 | Guenther et al. |
| 2007/0178039 A1 | 8/2007 | D'Evelyn et al. |
| 2007/0181056 A1 | 8/2007 | D'Evelyn et al. |
| 2007/0190758 A1 | 8/2007 | Kaeding et al. |
| 2007/0197004 A1 | 8/2007 | Dadgar et al. |
| 2007/0210074 A1 | 9/2007 | Maurer et al. |
| 2007/0215033 A1 | 9/2007 | Imaeda et al. |
| 2007/0228404 A1 | 10/2007 | Tran et al. |
| 2007/0234946 A1 | 10/2007 | Hashimoto et al. |
| 2007/0252164 A1 | 11/2007 | Zhong et al. |
| 2007/0274359 A1 | 11/2007 | Takeuchi et al. |
| 2007/0290224 A1 | 12/2007 | Ogawa |
| 2008/0006831 A1 | 1/2008 | Ng |
| 2008/0008855 A1 | 1/2008 | D'Evelyn et al. |
| 2008/0023691 A1 | 1/2008 | Jang et al. |
| 2008/0025360 A1 | 1/2008 | Eichler et al. |
| 2008/0073660 A1 | 3/2008 | Ohno et al. |
| 2008/0083741 A1 | 4/2008 | Giddings et al. |
| 2008/0083929 A1 | 4/2008 | Fan et al. |
| 2008/0087919 A1 | 4/2008 | Tysoe et al. |
| 2008/0106212 A1 | 5/2008 | Yen et al. |
| 2008/0121906 A1 | 5/2008 | Yakushiji |
| 2008/0128752 A1 | 6/2008 | Wu |
| 2008/0156254 A1 | 7/2008 | Dwilinski et al. |

| | | | |
|---|---|---|---|
| 2008/0193363 | A1 | 8/2008 | Tsuji |
| 2008/0198881 | A1 | 8/2008 | Farrell et al. |
| 2008/0211416 | A1 | 9/2008 | Negley et al. |
| 2008/0230765 | A1 | 9/2008 | Yoon et al. |
| 2008/0272462 | A1 | 11/2008 | Shimamoto et al. |
| 2008/0282978 | A1 | 11/2008 | Butcher et al. |
| 2008/0285609 | A1 | 11/2008 | Ohta et al. |
| 2008/0298409 | A1 | 12/2008 | Yamashita et al. |
| 2009/0078955 | A1 | 3/2009 | Fan et al. |
| 2009/0092536 | A1 | 4/2009 | Kawabata et al. |
| 2009/0146170 | A1 | 6/2009 | Zhong et al. |
| 2009/0218593 | A1 | 9/2009 | Kamikawa et al. |
| 2009/0250686 | A1 | 10/2009 | Sato et al. |
| 2009/0301387 | A1 | 12/2009 | D'Evelyn |
| 2009/0301388 | A1 | 12/2009 | D'Evelyn |
| 2009/0309110 | A1 | 12/2009 | Raring et al. |
| 2009/0320744 | A1 | 12/2009 | D'Evelyn et al. |
| 2009/0320745 | A1 | 12/2009 | D'Evelyn et al. |
| 2010/0001300 | A1 | 1/2010 | Raring et al. |
| 2010/0003492 | A1 | 1/2010 | D'Evelyn |
| 2010/0025656 | A1 | 2/2010 | Raring et al. |
| 2010/0031872 | A1 | 2/2010 | D'Evelyn |
| 2010/0031873 | A1 | 2/2010 | D'Evelyn |
| 2010/0031874 | A1 | 2/2010 | D'Evelyn |
| 2010/0031875 | A1 | 2/2010 | D'Evelyn |
| 2010/0031876 | A1 | 2/2010 | D'Evelyn |
| 2010/0032691 | A1 | 2/2010 | Kim |
| 2010/0108985 | A1 | 5/2010 | Chung et al. |
| 2010/0109030 | A1 | 5/2010 | Krames et al. |
| 2010/0117101 | A1 | 5/2010 | Kim et al. |
| 2010/0117118 | A1 | 5/2010 | Dabiran et al. |
| 2010/0147210 | A1 | 6/2010 | D'Evelyn |
| 2010/0151194 | A1 | 6/2010 | D'Evelyn |
| 2010/0219505 | A1 | 9/2010 | D'Evelyn |
| 2010/0295088 | A1 | 11/2010 | D'Evelyn et al. |
| 2011/0017298 | A1 | 1/2011 | Lee |
| 2011/0100291 | A1 | 5/2011 | D'Evelyn |
| 2011/0108081 | A1 | 5/2011 | Werthen et al. |
| 2011/0121331 | A1 | 5/2011 | Simonian et al. |
| 2011/0175200 | A1 | 7/2011 | Yoshida |
| 2011/0183498 | A1 | 7/2011 | D'Evelyn |
| 2011/0220912 | A1 | 9/2011 | D'Evelyn |
| 2011/0256693 | A1 | 10/2011 | D'Evelyn et al. |
| 2011/0262773 | A1 | 10/2011 | Poblenz et al. |
| 2012/0000415 | A1 | 1/2012 | D'Evelyn et al. |
| 2012/0007102 | A1 | 1/2012 | Feezell et al. |
| 2012/0073494 | A1 | 3/2012 | D'Evelyn |
| 2012/0091465 | A1 | 4/2012 | Krames et al. |
| 2012/0118223 | A1 | 5/2012 | D'Evelyn |
| 2012/0137966 | A1 | 6/2012 | D'Evelyn et al. |
| 2012/0178215 | A1 | 7/2012 | D'Evelyn |
| 2012/0187412 | A1 | 7/2012 | D'Evelyn et al. |
| 2012/0199952 | A1 | 8/2012 | D'Evelyn et al. |

FOREIGN PATENT DOCUMENTS

| | | |
|---|---|---|
| WO | WO 2005121415 A1 | 12/2005 |
| WO | WO2007-004495 | 1/2007 |
| WO | WO2012-016033 | 2/2012 |

OTHER PUBLICATIONS http://www.matbase.com/material/non-ferrous-metals/other/molybdenum/properties, Data Table for: Non-Ferrous Metals: Other Metals: Molybdenum.

Pattison et al., 'Gallium Nitride Based Microcavity Light Emitting Diodes With 2λ Effective Cavity Thickness', Applied Physics Letters, vol. 90, Issue 3, 031111 (2007) 3pg.

USPTO Office Action for U.S. Appl. No. 12/133,364 dated Nov. 26, 2010.

USPTO Office Action for U.S. Appl. No. 12/133,364 dated Jun. 1, 2011.

USPTO Notice of Allowance for U.S. Appl. No. 12/133,364 dated Oct. 11, 2011.

USPTO Office Action for U.S. Appl. No. 12/133,365 dated Jun. 9, 2011.

USPTO Office Action for U.S. Appl. No. 12/133,365 dated Oct. 18, 2011.

USPTO Office Action for U.S. Appl. No. 12/334,418 dated Apr. 5, 2011.

USPTO Office Action for U.S. Appl. No. 12/334,418 dated Oct. 19, 2011.

USPTO Office Action for U.S. Appl. No. 12/478,736 dated Sep. 27, 2011.

USPTO Notice of Allowance for U.S. Appl. No. 12/478,736 dated Apr. 23, 2012.

USPTO Office Action for U.S. Appl. No. 12/484,095 dated Nov. 10, 2010.

USPTO Office Action for U.S. Appl. No. 12/484,095 dated Jul. 8, 2011.

USPTO Office Action for U.S. Appl. No. 12/534,838 dated May 3, 2011.

USPTO Office Action for U.S. Appl. No. 12/534,838 dated Jan. 13, 2012.

USPTO Office Action for U.S. Appl. No. 12/534,838 dated Mar. 20, 2012.

USPTO Notice of Allowance for U.S. Appl. No. 12/534,838 dated Jun. 8, 2012.

USPTO Office Action for U.S. Appl. No. 12/534,844 dated Sep. 16, 2010.

USPTO Office Action for U.S. Appl. No. 12/534,844 dated Feb. 2, 2011.

USPTO Office Action for U.S. Appl. No. 12/534,857 dated Sep. 1, 2010.

USPTO Notice of Allowance for U.S. Appl. No. 12/534,857 dated May 27, 2011.

USPTO Office Action for U.S. Appl. No. 12/546,458 dated Jul. 20, 2011.

USPTO Notice of Allowance for U.S. Appl. No. 12/546,458 dated Nov. 28, 2011.

USPTO Office Action for U.S. Appl. No. 12/556,558 dated Sep. 16, 2010.

USPTO Notice of Allowance for U.S. Appl. No. 12/556,558 dated Mar. 22, 2011.

USPTO Office Action for U.S. Appl. No. 12/556,562 dated Sep. 15, 2010.

USPTO Office Action for U.S. Appl. No. 12/556,562 dated Mar. 21, 2011.

USPTO Notice of Allowance for U.S. Appl. No. 12/556,562 dated Jul. 27, 2011.

USPTO Office Action for U.S. Appl. No. 12/569,337 dated May 9, 2012.

USPTO Office Action for U.S. Appl. No. 12/634,665 dated Apr. 25, 2012.

USPTO Notice of Allowance for U.S. Appl. No. 12/754,886 dated May 17, 2012.

USPTO Notice of Allowance for U.S. Appl. No. 12/754,886 dated Jun. 5, 2012.

USPTO Notice of Allowance for U.S. Appl. No. 12/754,886 dated Jun. 20, 2012.

Chiang et al. "Luminescent Properties of Cerium-Activated Garnet Series Phosphor: Structure and Temperature Effects," Journal of the Electrochemical Society 155:B517-B520 (2008).

Chiu et al. "Synthesis and Luminescence Properties of Intensely Red-Emitting $M5Eu(WO_4)_{4-x}(MoO_4)_x$ (M = Li, Na, K) Phosphors," Journal of the Electrochemical Society 15:J71-J78 (2008).

Ci et al. "$Ca_{1-x}Mo_{1-y}Nb_yO_4:Eu_x^{3+}$: A novel red phosphor for white light emitting diodes," Journal of Physics 152:670-674 (2008).

Happek "Development of Efficient UV-LED Phosphor Coatings for Energy Saving Solid State Lighting" University of Georgia (Jan. 2007).

Höppe et al. "Luminescence in $Eu^{2+}$-doped $Ba_2Si_5N_8$: fluorescence, thernoliminescence, and upconversion"; Journal of Physics and Chemistry of Solids 61:2001-2006 (2000).

Li et al. "The effect of replacement of Sr by Ca on the structural and luminescence properties of the red-emitting $Sr_2Si_5N_8:Eu_2+$ LED conversion phosphor," Journal of Solid State Chemistry 181:515-524 (2008).

Mueller-Mach et al. "Highly efficient all-nitride phosphor-converted white light emitting diode," Physica Status Solidi (a) 202:1727-1732 (Jul. 2005).

Setlur et al. "Crystal chemistry and luminescence of $Ce^{3+}$-doped $(Lu_2CaMg_2)$-Ca-2(Si, $Ge)_3O_{12}$ and its use in LED based lighting," Chemistry of Materials 18: 3314-3322 (2006).
Wang et al. "New red $Y_{0.85}Bi_{0.1}Eu_{0.05}V_{1-y}M_yO_4$ (M=Nb, P) phosphors for light-emitting diodes," Physica B: Condensed Matter 403:2071-2075 (Jun. 2008).
Yamamoto "White LED phosphors: the next step," Proceeding of . SPIE (2010).
Yang et al. "Preparation and luminescence properties of LED conversion novel phosphors $SrZnO_2$:Sm," Materials Letters 62:907-910 (Mar. 2008).
Byrappa et al., "Handbook of Hydrothermal Technology: A Technology for Crystal Growth and Materials Processing," Noyes Publications, Park Ridge, New Jersey, 2001, pp. 94-96 and 152.
Callahan et al., "Synthesis and Growth of Gallium Nitride by the Chemical Vapor Reaction Process (CVRP)," 1999, MRS Internet Journal Nitride Semiconductor Research, vol. 4, Issue No. 10, pp. 1-6.
D'Evelyn et al., "Bulk GaN Crystal Growth by the High-Pressure Ammonothermal Method," Journal of Crystal Growth, 2007, vol. 300, pp. 11-16.
Dwilinski et al., "Excellent Crystallinity of Truly Bulk Ammonothermal GaN," Journal of Crystal Growth, 2008, vol. 310, pp. 3911-3916.
Ehrentraut et al., "Prospects for the Ammonothermal Growth of Large GaN Crystal," Journal of Crystal Growth, 2007, vol. 305, pp. 304-310.
Farrell et al., "Continuous-wave Operation of AlGaN-cladding-free Nonpolar m-Plane InGaN/GaN Laser Diodes," 2007, Japanese Journal of Applied Physics, vol. 46, No. 32, pp. L761-L763.
Feezell et al., "AlGaN-Cladding-Free Nonpolar InGaN/GaN Laser Diodes," Japanese Journal of Applied Physics, vol. 46, No. 13, pp. L284-L286.
Frayssinet et al., "Evidence of Free Carrier Concentration Gradient Along the c-axis for Undoped GaN Single Crystals," Journal of Crystal Growth, 2001, vol. 230, pp. 442-447.
Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.
Kim et al, "Improved Electroluminescence on Nonpolar m-plane InGaN/GaN Qantum Well LEDs", 2007, Physica Status Solidi (RRL), vol. 1, No. 3, pp. 125-127.
Kojima et al., "Stimulated Emission at 474 nm from an InGaN Laser Diode Structure Grown on a (1122) GaN Substrate ," 2007, Applied Physics Letter, vol. 91, No. 25, pp. 251107-251107-3.
Kubota et al., "Temperature Dependence of Polarized Photoluminescence from Nonpolar m-plane InGaN Multiple Quantum Wells for Blue Laser Diodes" 2008, Applied Physics Letter, vol. 92, pp. 011920-011920-3.
Mirwald et al., "Low-Friction Cell for Piston-Cylinder High Pressure Apparatus," Journal of Geophysical Research, 1975, vol. 80, No. 11, pp. 1519-1525.
Murota et al., "Solid State Light Source Fabricated with YAG:Ce Single Crystal," 2002, Japanese Journal of Applied Physics, vol. 46, No. 41, Part 2, No. 8A, pp. L887-L888.
Okamoto et al., "Continuous-Wave Operation of m-Plane InGaN Multiple Quantum Well Laser Diodes," 2007, Japanese Journal of Applied Physics, vol. 46, No. 9, pp. L187-L189.
Okamoto et al., "Pure Blue Laser Diodes Based on Nonpolar m-Plane Gallium Nitride with InGaN Waveguiding Layers," 2007, Japanese Journal of Applied Physics, vol. 46, No. 35, pp. L820-L822.
Oshima et al., "Thermal and Optical Properties of Bulk GaN Crystals Fabricated Through Hydride Vapor Phase Epitaxy with Void-Assisted Separation," 2005, Journal of Applied Physics, vol. 98, pp. 103509-1-103509-3.
Sato et al., "High Power and High Efficiency Green Light Emitting Diode on free-Standing Semipolar (1122) Bulk GaN Substrate," 2007.Physica Status Solidi (RRL), vol. 1, pp. 162-164.
Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.

Schmidt et al., "Demonstration of Nonpolar m-Plane InGaN/GaN Laser Diodes ," 2007, Japanese Journal of Applied Physics, vol. 46, No. 9, L190-L191.
Sizov et al., "500-nm Optical Gain Anisotropy of Semipolar (1122) InGaN Quantum Wells," 2009, Applied Physics Express, vol. 2, pp. 071001-1-071001-3.
Tsuda et al., "Blue Laser Diodes Fabricated on m-Plane GaN Substrates," 2008, Applied Physics Express, vol. 1, pp. 011104-011104-03.
Tyagi et al., "Semipolar (1011) InGaN/GaN Laser Diodes on Bulk GaN Substrates," 2007, Japanese Journal of Applied Physics, vol. 46, No. 19, pp. L444-L445.
Wang et al., "Ammonothermal Synthesis of III-Nitride Crystals," Crystal Growth & Design, 2006, vol. 6, Issue No. 6, pp. 1227-1246.
Wang et al., "Synthesis of Dense Polycrystaline GaN of High Purity by the Chemical Vapor Reaction Process," Journal of Crystal Growth, 2006, vol. 286, pp. 50-54.
Zhong et al., "Demonstration of High Power Blue-Green Light Emitting Diode on Semipolar (1122) Bulk GaN Substrate," 2007, Electron Letter, vol. 43, No. 15, pp. 825-826.
Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.
Office action for U.S. Appl. No. 12/497,969 (Feb. 2, 2012).
Office action for U.S. Appl. No. 12/478,736 (Feb. 7, 2012).
Office action for U.S. Appl. No. 12/569,841 (Dec. 23, 2011).
Office action for U.S. Appl. No. 12/724,983 (Mar. 5, 2012).
Office action for U.S. Appl. No. 12/785,404 (Mar. 6, 2012).
Office action for U.S. Appl. No. 12/491,176 (Mar. 1, 2012).
Fukuda et al. "Prospects for the ammonothermal growth of large GaN crystal," Journal of Crystal Growth 305: 304-310 (Jul. 2007).
Hashimoto et al. "Ammonothermal growth of bulk GaN," Journal of Crystal Growth 310:3907-3910 (Aug. 2008).
Hashimoto et al. "A GaN bulk crystal wit improved structural quality grown by the ammonothermal method," Nature Materials 6:568-671 (Jul. 2007).
Sarva, et al. "Dynamic compressive strength of silicon carbide under uniaxial compression," Mat. Sci. & Eng. A 317,140 (2001).
Wang et al. "Ammonothermal growth of GaN crystals in alkaline solutions," Journal of crystal Growth 287:376-380 (Jan. 2006).
Dwiliński et al., AMMONO Method of BN, AlN, and GaN Synthesis and Crystal Growth,: Journal of Nitride Semiconductor Research, 1998, 3,25, MRS, Internet: http://nsr.mij.mrs.org.
Kolis et al., "Crystal Growth of Gallium Nitride in Supercritical Ammonia," Journal of Crystal Growth, 2001, vol. 222, pp. 431-434.
Kolis et al., "Materials Chemistry and Bulk Crystal Growth of Group III Nitrides in Supercritical Ammonia" Mat. Res. Soc. Symp. Proc., 1998, vol. 495, pp. 367-372.
Motoki et al. "Growth and Characterization of Freestanding GaN Substrates," Journal of Crystal Growth, 2002, vol. 237-239, pp. 912-921.
Peters, "Ammonothermal Synthesis of Aluminium Nitride," Journal of Crystal Growth, 1999, vol. 4, pp. 411-418.
USPTO Office Action for U.S. Appl. No. 12/497,969 dated Jul. 5, 2012.
USPTO Notice of Allowance for U.S. Appl. No. 12/534,849 dated Jul. 31, 2012.
USPTO Notice of Allowance for U.S. Appl. No. 12/785,404 dated Jul. 16, 2012.
USPTO Office Action for U.S. Appl. No. 13/179,346 dated Aug. 17, 2012.
USPTO Notice of Allowance for U.S. Appl. No. 13/425,304 dated Aug. 22, 2012.
Choi et al., '2.51 microcavity InGaN light-emitting diodes fabricated by a selective dry-etch thinning process', Applied Physics Letters, 2007, 91(6), 061120.
Weisbuch et al., 'Recent results and latest views on microcavity LEDs', Light-Emitting Diodes: Research, Manufacturing, and Applications VIII, ed. by S.A. Stockman et al., Proc. SPIE, vol. 5366, p. 1-19 (2004).
USPTO Notice of Allowance for U.S. Appl. No. 12/478,736 dated Oct. 9, 2012.

USPTO Notice of Allowance for U.S. Appl. No. 12/569,337 dated Nov. 15, 2012.
USPTO Office Action for U.S. Appl. No. 12/569,844 dated Oct. 12, 2012.
USPTO Office Action for U.S. Appl. No. 12/634,665 dated Oct. 1, 2012.
USPTO Office Action for U.S. Appl. No. 12/891,668 dated Sep. 25, 2012.
USPTO Office Action for U.S. Appl. No. 13/025,833 dated Jul. 12, 2012.
USPTO Office Action for U.S. Appl. No. 13/041,199 dated Nov. 30, 2012.
USPTO Office Action for U.S. Appl. No. 13/175,739 dated Dec. 7, 2012.
USPTO Office Action for U.S. Appl. No. 13/179,346 dated Dec. 13, 2012.
USPTO Office Action for U.S. Appl. No. 13/226,249 dated Oct. 10, 2012.

* cited by examiner

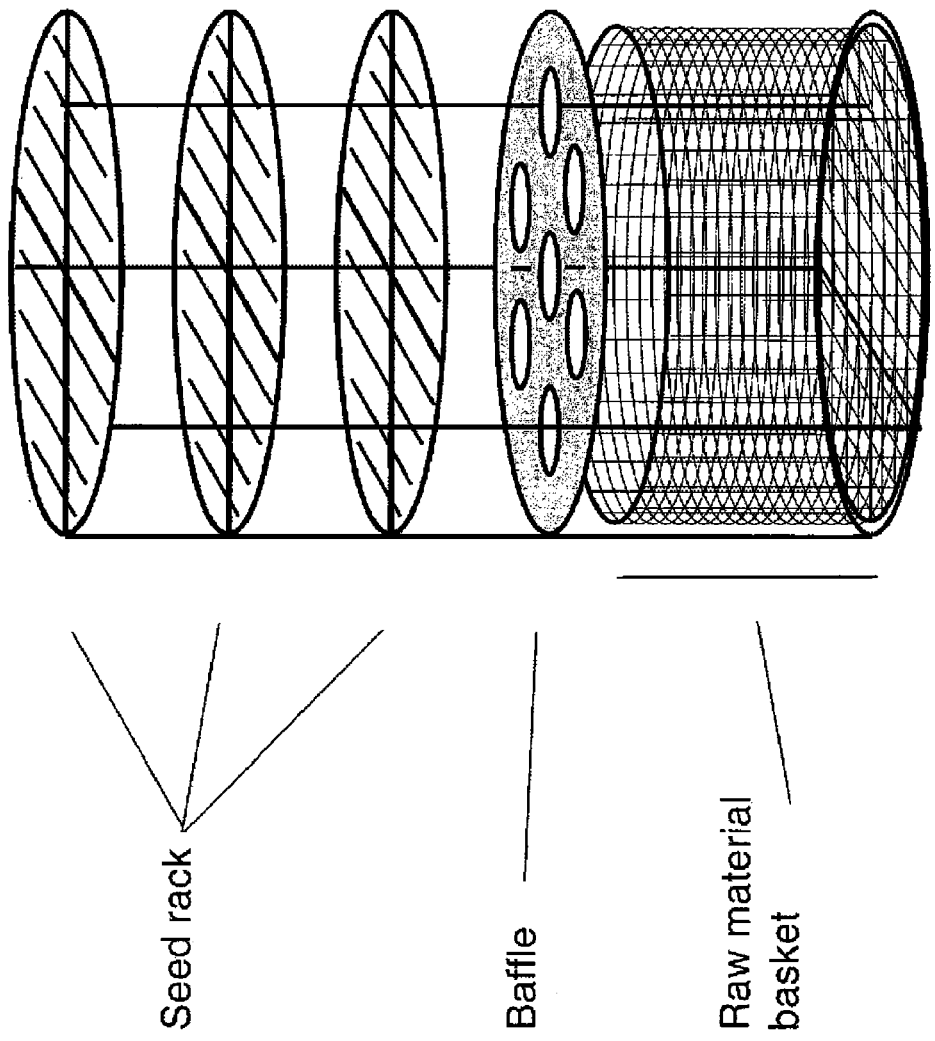
Fig. 1a – Frame

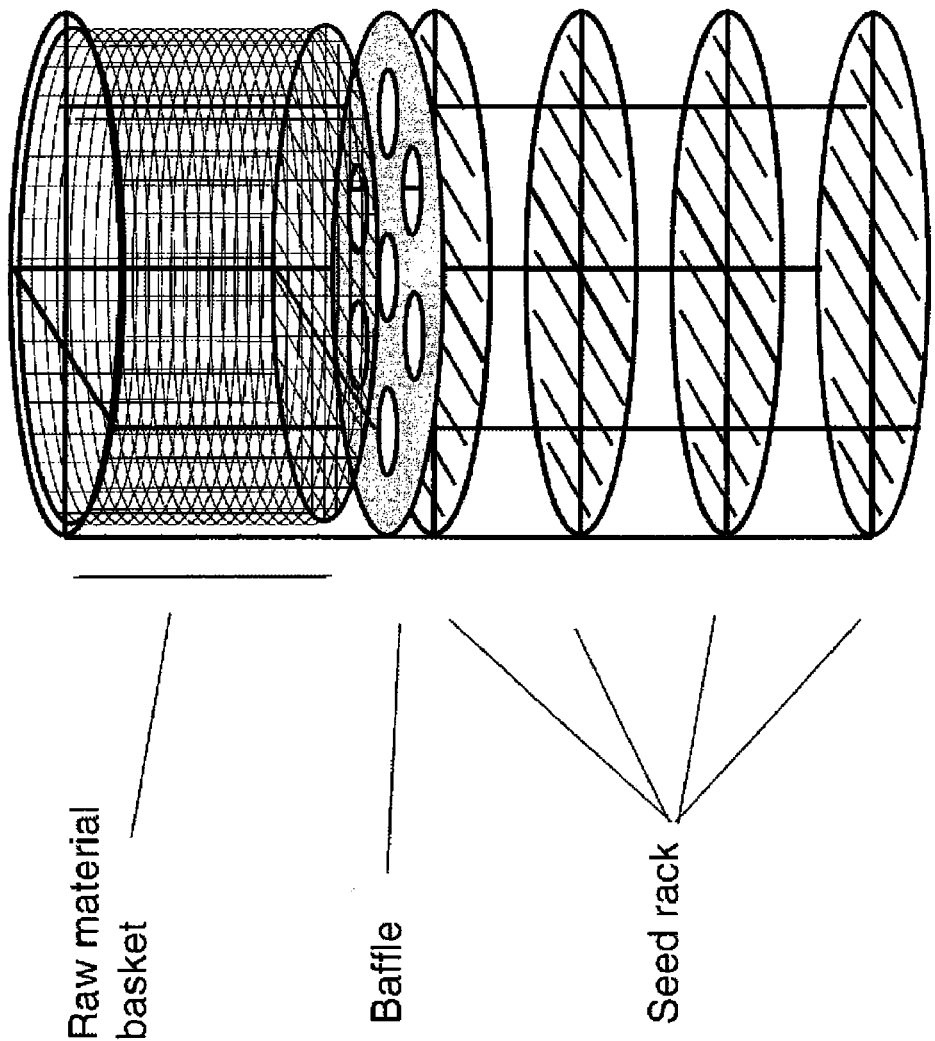
Fig. 1b – Frame
Raw material basket
Baffle
Seed rack

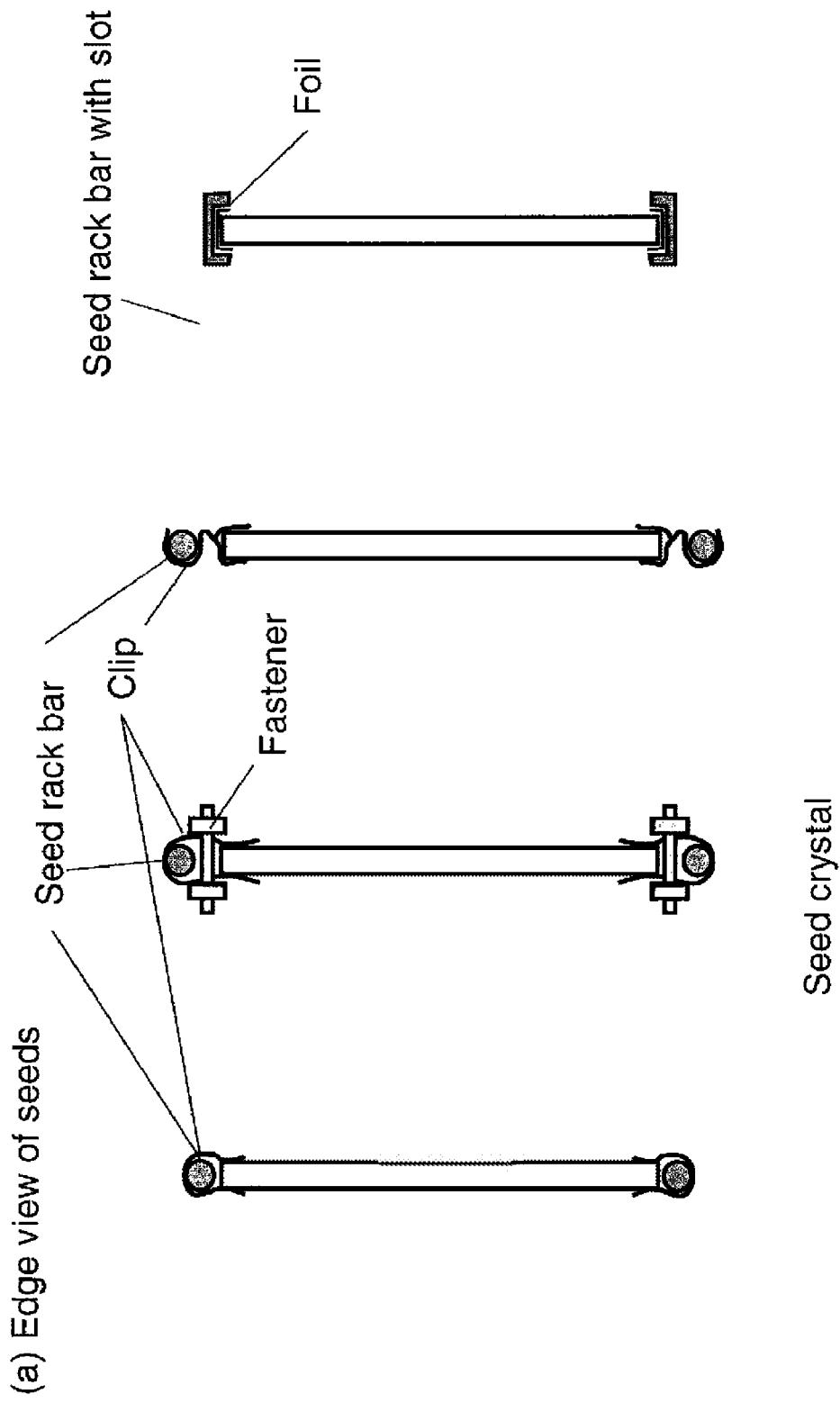

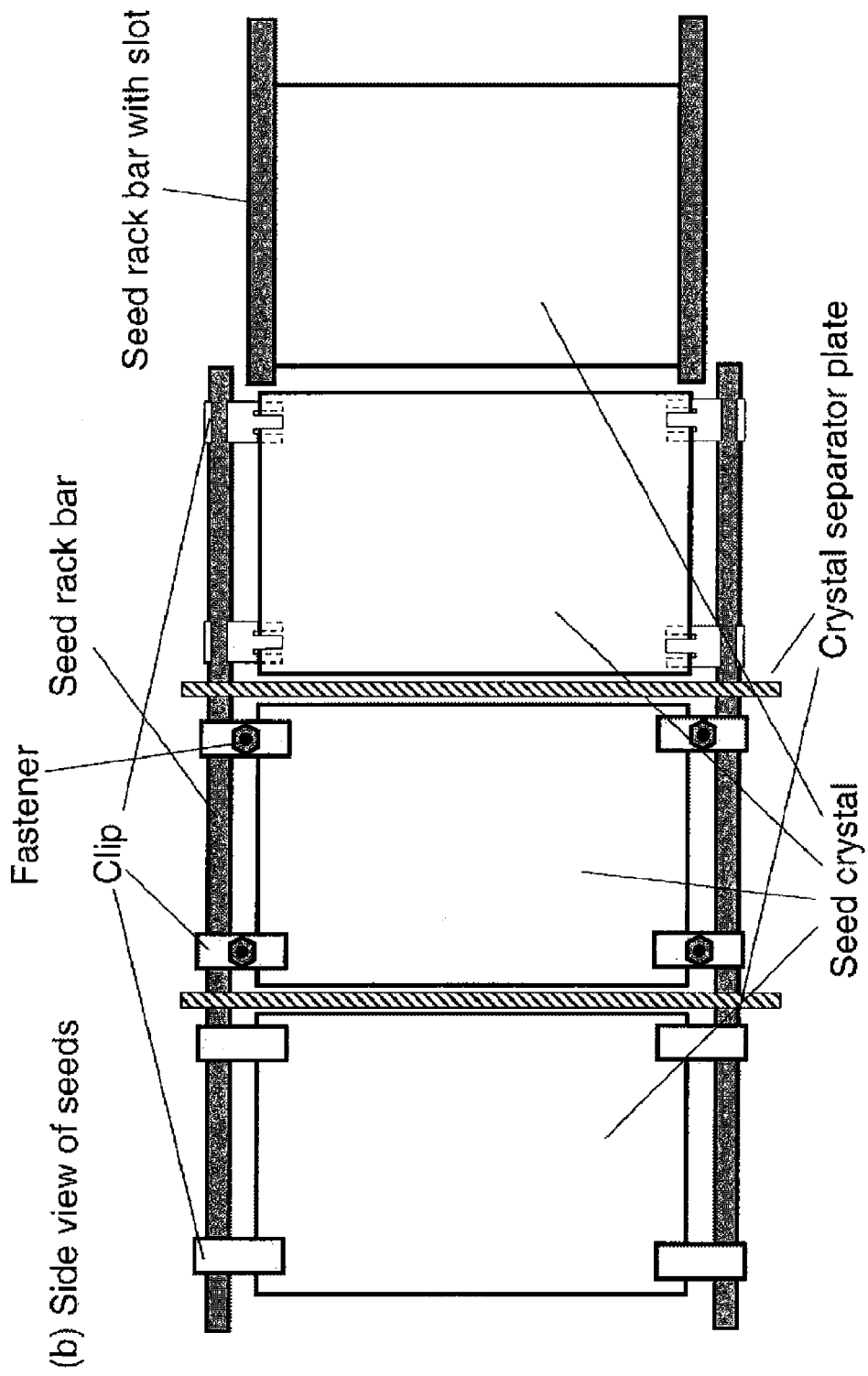
Fig. 2b – Seed attachment
(b) Side view of seeds

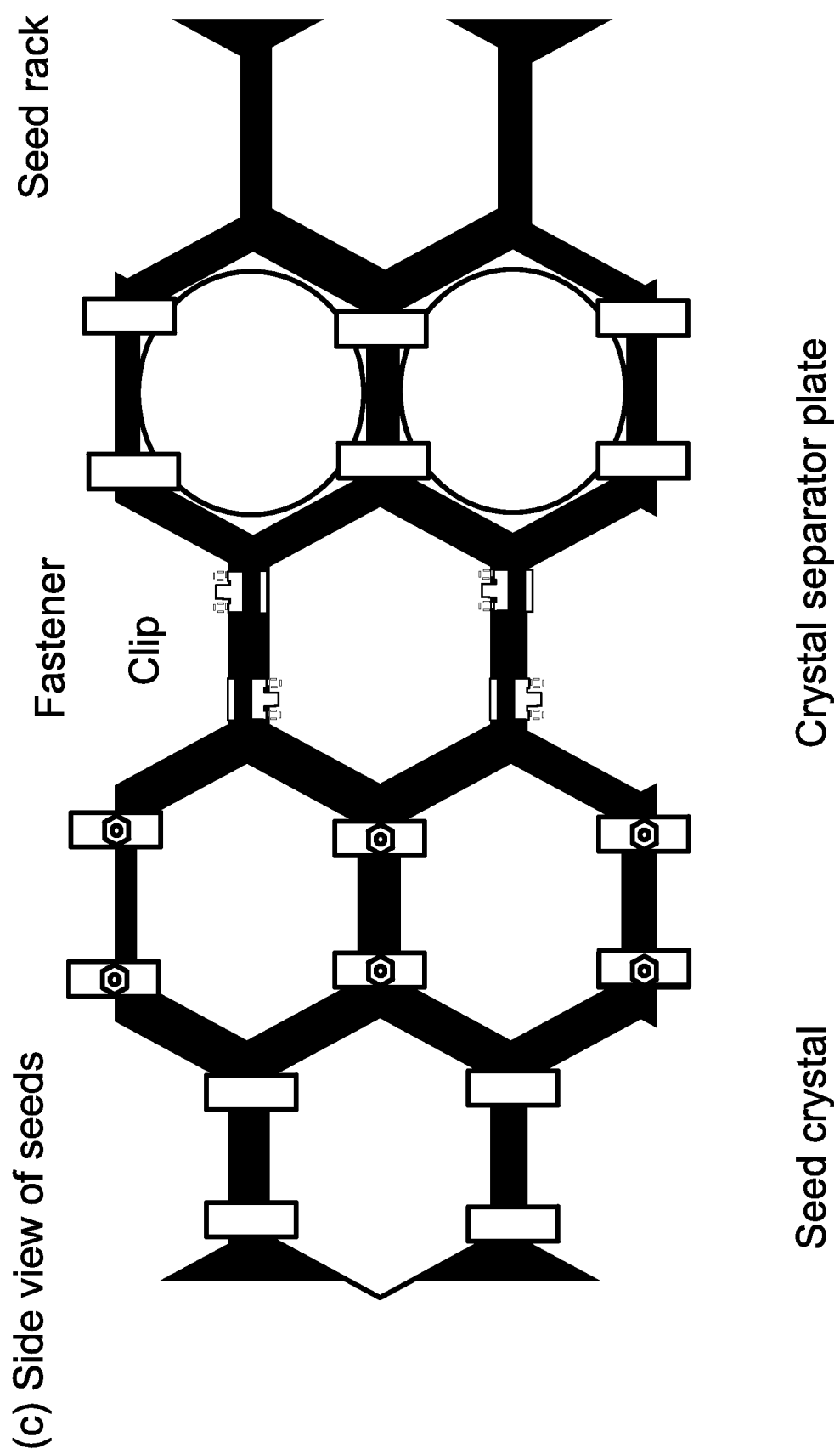
Fig. 2c – Seed attachment
(c) Side view of seeds

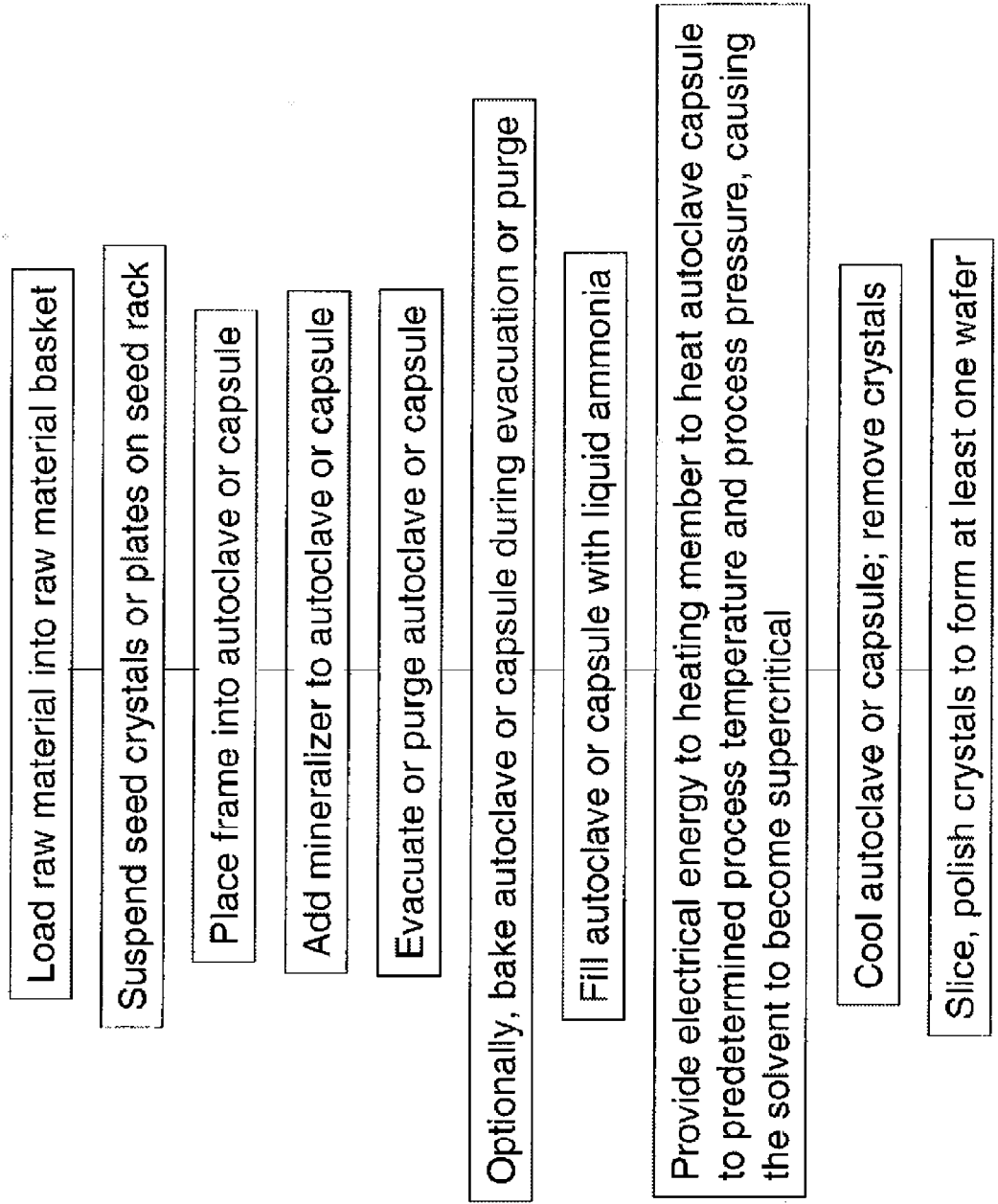
Fig. 3 – Flow diagram

APPARATUS AND METHOD FOR SEED CRYSTAL UTILIZATION IN LARGE-SCALE MANUFACTURING OF GALLIUM NITRIDE

CROSS-REFERENCES TO RELATED APPLICATIONS

This application claims priority to U.S. Provisional Patent Application No. 61/087,135, filed Aug. 7, 2008, commonly assigned, and of which is incorporated by reference in its entirety for all purposes hereby.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention generally relates to processing of materials for growth of crystal. More particularly, the present invention provides a method for obtaining a gallium-containing nitride crystal by an ammonobasic or ammonoacidic technique, but there can be others. In other embodiments, the present invention provides an apparatus for large scale processing of nitride crystals, but it would be recognized that other crystals and materials can also be processed. Such crystals and materials include, but are not limited to, GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

Gallium nitride containing crystalline materials serve as a starting point for manufacture of conventional optoelectronic devices, such as blue light emitting diodes and lasers. Such optoelectronic devices have been commonly manufactured on sapphire or silicon carbide substrates that differ in composition from the deposited nitride layers. In the conventional Metal-Organic Chemical Vapor Deposition (MOCVD) method, deposition of GaN is performed from ammonia and organometallic compounds in the gas phase. Although successful, conventional growth rates achieved make it difficult to provide a bulk layer of GaN material. Additionally, dislocation densities are also high and lead to poorer optoelectronic device performance.

Other techniques have been proposed for obtaining bulk monocrystalline gallium nitride. Such techniques include use of epitaxial deposition employing halides and hydrides in a vapor phase and is called Hydride Vapor Phase Epitaxy (HVPE) ["Growth and characterization of freestanding GaN substrates" K. Motoku et al., Journal of Crystal Growth 237-239, 912 (2002)]. Unfortunately, drawbacks exist with HVPE techniques. In some cases, the quality of the bulk monocrystalline gallium nitride is not generally sufficient for high quality laser diodes because of issues with dislocation density, stress, and the like.

Techniques using supercritical ammonia have been proposed. Peters has described the ammonothermal synthesis of aluminum nitride [J. Cryst. Growth 104, 411 418 (1990)]. R. Dwiliński et al. have shown, in particular, that it is possible to obtain a fine-crystalline gallium nitride by a synthesis from gallium and ammonia, provided that the latter contains alkali metal amides ($KNH_2$ or $LiNH_2$). These and other techniques have been described in "AMMONO method of BN, AlN, and GaN synthesis and crystal growth", Proc. EGW-3, Warsaw, Jun. 22 24, 1998, MRS Internet Journal of Nitride Semiconductor Research, http://nsr.mij.mrs.org/3/25, "Crystal growth of gallium nitride in supercritical ammonia" J. W. Kolis et al., J. Cryst. Growth 222, 431 434 (2001), and Mat. Res. Soc. Symp. Proc. Vol. 495, 367 372 (1998) by J. W. Kolis et al. However, using these supercritical ammonia processes, no wide scale production of bulk monocrystalline was achieved.

Dwiliński, in U.S. Pat. Nos. 6,656,615 and 7,335,262, and D'Evelyn, in U.S. Pat. Nos. 7,078,731 and 7,101,433, discuss apparatus and methods for conventional ammonothermal crystal growth of GaN. These methods are useful for growth of relatively small GaN crystals. Unfortunately, such methods have limitations for large scale manufacturing. The conventional apparatus with an inner diameter of 40 mm is useful for growing smaller diameter GaN crystals but is not suitable for large scale growth GaN boules. Additionally, conventional suspension of seed crystals using wires passing through single laser-drilled holes may be adequate for small crystals but is likely to be tedious and ineffective for large scale manufacturing. Other limitations may also exist.

From the above, it is seen that techniques for large scale crystal growth are highly desired.

BRIEF SUMMARY OF THE INVENTION

According to the present invention, techniques related to processing of materials for growth of crystal are provided. More particularly, the present invention provides a method for obtaining a gallium-containing nitride crystal by an ammonobasic or ammonoacidic technique, but there can be others. In other embodiments, the present invention provides an apparatus for large scale processing of nitride crystals, but it would be recognized that other crystals and materials can also be processed. Such crystals and materials include, but are not limited to, GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

In a specific embodiment, the present invention provides a seed rack for processing materials for crystal growth. In a specific embodiment, the seed rack includes clips to be configured to support varying seed shapes and sizes. In other embodiments, the invention provides a large scale high pressure ammonothermal apparatus, including seed rack, raw material basket, and baffle. Of course, there can be other variations, modifications, and alternatives.

In an alternative specific embodiment, the present invention provides a process for growing a crystalline gallium-containing nitride using one or more seed racks. The process includes providing an autoclave comprising a seed rack device, gallium-containing feedstock in one zone, and at least one seed in the seed rack device in another zone. In a specific embodiment, the process also includes introducing a solvent capable of forming a supercritical fluid into at least the one zone and the other zone and processing one or more portions of the gallium-containing feedstock in the supercritical fluid to provide a supercritical solution comprising at least gallium containing species at a first temperature. The process includes growing crystalline gallium-containing nitride material from the supercritical solution on the seed at a second temperature, which is characterized to cause the gallium containing species to form the crystalline gallium containing nitride material on the seed.

In yet an alternative specific embodiment, the present invention provides a system for growing a crystalline gallium-containing nitride using a plurality of seed racks. The system has an autoclave comprising a first zone and a second zone, with gallium-containing feedstock in the first zone and a seed rack provided within a vicinity of the second zone. The system has a plurality of sites numbered from 1 through N, where N is an integer greater than 2, disposed spatially from a first portion of the seed rack to a second portion of the seed rack. Each of the sites is configured to mechanically support at least one seed. Optionally, two or more of the plurality of sites are configured to arrange each of the seeds in a substantially parallel manner. Alternatively, two or more the plurality of sites are configured in either a first tier, a second tier, or an Nth tier. Of course, there can be other variations, modifications, and alternatives.

Still further, the present invention provides a method of crystal growth, e.g., GaN. The method includes providing an apparatus for high pressure crystal or material processing. In a preferred embodiment, the apparatus has a cylindrical capsule region comprising a first region and a second region, and a length defined between the first region and the second region. The apparatus has an annular heating member enclosing the cylindrical capsule region and at least one annular ceramic or metal or cermet member having a predetermined thickness disposed around a perimeter of the annular heating member. In a specific embodiment, the annular member can be made of a material having a compressive strength of about 0.5 GPa and greater and a thermal conductivity of about 100 watts per meter-Kelvin and less. A high strength enclosure material is disposed overlying the annular ceramic member. In a preferred embodiment, the method includes providing a capsule containing a seed rack, a baffle, a solvent, a mineralizer, a gallium-containing raw material, and at least a first seed and a second seed provided on a first site and a second site of the seed rack. The method includes placing the capsule within an interior region of the cylindrical capsule region and processing the capsule with thermal energy to cause an increase in temperature within the capsule to greater than 200 Degrees Celsius to cause the solvent to be superheated.

Benefits are achieved over pre-existing techniques using the present invention. In particular, the present invention enables a cost-effective high pressure apparatus for growth of crystals such as GaN, AlN, InN, InGaN, and AlInGaN and others. In a specific embodiment, the present method and apparatus can operate with components that are relatively simple and cost effective to manufacture. Depending upon the embodiment, the present apparatus and method can be manufactured using conventional materials and/or methods according to one of ordinary skill in the art. The present apparatus and method enable cost-effective crystal growth and materials processing under extreme pressure and temperature conditions in batch volumes larger than 0.3 liters, larger than 1 liter, larger than 3 liters, larger than 10 liters, larger than 30 liters, larger than 100 liters, and larger than 300 liters according to a specific embodiment. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIGS. 1a and 1b are crystal growth frame structures according to embodiments of the present invention.

FIGS. 2a, 2b, and 2c are crystal growth seed rack structures according to embodiments of the present invention.

FIG. 3 is a simplified diagram of flow chart illustrating a crystal growth process according to an embodiment of the present invention.

DETAILED DESCRIPTION OF THE INVENTION

According to the present invention, techniques related to processing of materials for growth of crystal are provided. More particularly, the present invention provides a method for obtaining a gallium-containing nitride crystal by an ammonobasic or ammonoacidic technique, but there can be others. In other embodiments, the present invention provides an apparatus for large scale processing of nitride crystals, but it would be recognized that other crystals and materials can also be processed. Such crystals and materials include, but are not limited to, GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

In the discussion that follows, the inventive apparatus is described as being vertically oriented. In another embodiment, the apparatus is instead horizontally oriented or oriented at an oblique angle intermediate between vertical and horizontal, and may be rocked so as to facilitate convection of the supercritical fluid within the high pressure apparatus. Referring to FIG. 3, I also illustrate a simplified flow diagram of a process for crystal growth according to an embodiment of the present invention. This flow diagram should not be limiting and can be used for cross-referencing purposes.

A schematic of a frame for seed crystals and raw material is shown in FIGS. 1a and 1b. The frame enables seed crystals and raw material to be loaded into a suitable configuration for crystal growth prior to placement inside the high pressure apparatus and in a form that is convenient for subsequent handling. The frame should retain good rigidity under crystal growth conditions and be chemically inert to the crystal growth environment, neither contributing contamination to the growing crystals nor undergoing significant corrosion. The materials of construction of the frame and the components thereof may include one or more of copper, copper-based alloy, gold, gold-based alloy, silver, silver-based alloy, palladium, platinum, iridium, ruthenium, rhodium, osmium, titanium, vanadium, chromium, iron, iron-based alloy, nickel, nickel-based alloy, zirconium, niobium, molybdenum, tantalum, tungsten, rhenium, silica, alumina, combinations thereof, and the like. Iron-base alloys that may be used to form the frame include, but are not limited to, stainless steels. Nickel-base alloys that may be used to form the frame include, but are not limited to, inconel, hastelloy, and the like. Again, there can be other variations, modifications, and alternatives. In some embodiments, the components of the frame are fabricated from an alloy comprising at least two elements, for increased hardness and creep resistance. The frame and its components may comprise wire, wire cloth or mesh, foil, plate, sheet, square bar, round bar, rectangular bar, tubing, threaded rod, and fasteners. The frame and its components may be attached by means of welding, arc welding, resistance welding, brazing, clamping, crimping, attachment by means of fasteners such as at least one of screws, bolts, threaded rod, and nuts, and the like.

The frame may include, as components, a baffle, a raw material basket, and a rack for suspending seed crystals, plus a means for attaching at least two of the aforementioned components. In one set of embodiments, illustrated in FIG. 1a, appropriate for the case where the crystal to be grown has a solubility that increases with increasing temperature, the basket is positioned below the baffle and the seed rack is positioned above the baffle. In another set of embodiments, illustrated in FIG. 1b, appropriate for the case where the crystal to be grown has a solubility that decreases with increasing temperature, i.e., retrograde solubility, the basket is positioned above the baffle and the seed rack is positioned below the baffle. A larger volume may be provided for the crystal growing region, that is, the region containing the seed rack, than for the nutrient region, that is, the region containing the basket. In one specific embodiment, the ratio of the volumes of the crystal growing region and the nutrient region is between 1 and 5. In other embodiments, this ratio is between 1.25 and 3, or between 1.5 and 2.5. The overall diameter and height of the frame are chosen for a close fit within the high pressure apparatus, so as to maximize the utilization of the available volume and optimize the fluid dynamics. The diameter of the frame may be between 1 inch and 2 inches, between 2 inches and 3 inches, between 3 inches and 4 inches, between 4 inches and 6 inches, between 6 inches and 8 inches, between 8 inches and 10 inches, between 10 inches and 12 inches, between 12 inches and 16 inches, between 16 inches and 24 inches, or greater than 24 inches. The ratio of the overall height of the frame to its diameter may be between 1 and 2, between 2 and 4, between 4 and 6, between 6 and 8, between 8 and 10, between 10 and 12, between 12 and 15, between 15 and 20, or greater than 20.

The baffle provides a means for dividing the high pressure apparatus into which the frame is to be inserted into two separate regions, and comprises one or more disks. The two regions are in fluid communication with each other, as baffle has a plurality of through-holes, or openings. Thus, a fraction of the cross-sectional area of the baffle is open. In a specific embodiment, baffle has a fractional open area of between about 0.5% and about 30%, but can also have other percentages. In other embodiments, the baffle has a fractional open area between 2% and 20%, or between 5% and 15%. The baffle serves the purpose of confining the at least one (or more) raw material to a specific region or end of chamber while permitting solvent and, under high pressure high temperature (HPHT) conditions, supercritical fluid, to migrate throughout the high pressure apparatus by passing freely through through-holes in baffle. Often times, this feature is particularly useful in applications such as crystal growth, in which the supercritical fluid transports the at least one material, a nutrient material, from one region of the chamber, defined by placement of the baffle, to another region where crystal growth on seed crystals take place. In one specific embodiment, the diameter of the baffle is equal to the maximum diameter of the overall frame. In other embodiments, the diameter of the baffle is slightly less than the maximum diameter of the overall frame, providing an annular space through which fluid can flow under crystal growth conditions. The diameter of the baffle may be less than the maximum diameter of the overall frame by 0.5 inch or less. The openings in the baffle should be large enough so as not to clog readily. In one specific embodiment, the diameters of the openings in the baffle are between 0.020 inch and 0.5 inch. In another embodiment, the diameters of the openings in the baffle are between 0.050 inch and 0.25 inch. In one specific embodiment, the baffle comprises a single disk with a thickness between 0.020 inch and 0.5 inch. In another embodiment, the baffle comprises a single disk with a thickness between 0.050 inch and 0.25 inch. In some embodiments, the baffle comprises two disks, three disks, or more. In some multi-disk embodiments one or more of the openings in the disks lie above one another. In other multi-disk embodiments, one or more of the openings in the disks do not lie above one another. The effective fractional open area in multi-disk baffle embodiments may therefore lie between the fractional open area of each disk, as an upper bound, and the product of the fractional open areas of each disk.

The raw material basket provides a convenient means for transferring the raw material into the high pressure apparatus, for permitting facile fluid communication from the region between raw material particles within the basket and the crystal growth region, and for removing un-consumed raw material from the reactor at the conclusion of a growth run. In one embodiment, the basket comprises wire mesh or wire cloth, as indicated schematically in the Figures. The diameter of the wire in the mesh or cloth may be between 0.001 inch and 0.25 inch, between 0.005 inch and 0.125 inch, or between 0.010 inch and 0.080 inch. The wire mesh or wire cloth may be contained within and, optionally, attached to a frame comprising larger-diameter wire so as to provide improved mechanical support. In another embodiment, the basket comprises foil or plate with a plurality of through-holes or openings. The size of the openings in the wire mesh, wire cloth, or foil or plate should be small enough so that raw material particles do not pass through them during crystal growth, even after a significant portion of the raw material has been etched and/or consumed by the crystal growth operation. In one specific embodiment, the openings in the wire mesh, wire cloth, or foil or plate have a diameter between 0.005 inch and 0.5 inch. In other embodiments, the openings have a diameter between 0.010 inch and 0.125 inch, or between 0.025 inch and 0.080 inch. In some embodiments, hollow pipes, with openings that are covered by wire mesh, are placed within the basket prior to loading of the raw material so as to improve fluid communication between the region between raw material particles within the basket and the crystal growth region. Suitable configurations for such hollow pipes are discussed by U.S. Pat. No. 3,245,760, which is hereby incorporated by reference in its entirety.

In some embodiments, the raw material is placed in the basket prior to placement of seed crystals on the seed rack, so as to minimize the likelihood of breakage of the latter. The raw material may be supplied in various forms. In some embodiments, the raw material comprises single crystals or chunks or grit of polycrystalline material. In other embodiments, the raw material comprises chunks of sintered polycrystalline material. In the case of gallium nitride, the raw material may be derived from by-product single- or poly-crystalline GaN deposited on the wall or miscellaneous surfaces with a hydride vapor phase epitaxy (HVPE) reactor. In another specific embodiment, the raw material comprises plates of single- or poly-crystalline GaN grown on a substrate by HVPE. In another specific embodiment, the raw material is derived from sintered GaN powder, as disclosed by U.S. Pat. No. 6,861,130, which is hereby incorporated by reference in its entirety. In another specific embodiment, the raw material is derived from polycrystalline GaN plates comprising a columnar microstructure, as disclosed by US patent application 2007/0142204A1, which is hereby incorporated by reference in its entirety. The raw material may contain oxygen at a concentration below $10^{19}$ cm$^{-3}$, below $10^{18}$ cm$^{-3}$, or below $10^{17}$ cm$^{-3}$. The raw material may contain an n-type dopant, such as Si or O, a p-type dopant, such as Mg or Zn, a compensatory dopant, such as Fe or Co, or a magnetic dopant, such as Fe, Ni, Co, or Mn, at concentrations between $10^{16}$ cm$^{-3}$ and $10^{21}$ cm$^{-3}$. In one specific embodiment, the particle size distribution of the raw material lies between about 0.020 inch and about 5 inches. In another embodiment, the particle size distribution of the raw material lies between about 0.050 inch and about 0.5 inch. In a preferred embodiment, the total surface area of the raw material is greater, by at least a factor of three, than the total surface area of all the seed crystals that are placed in the seed rack.

In some embodiments, the raw material comprises a metal that will become molten at elevated temperatures, for example, gallium, indium, sodium, potassium, or lithium. If placed in direct contact with the inner surface of the autoclave or capsule the metal may form an alloy, compromising the integrity of the autoclave or capsule. In some embodiments, therefore, at least one crucible is placed within or proximate to the raw material basket and contains at least one metal. The crucible should be chemically inert with respect to the supercritical fluid crystal growth environment and should not react or alloy with the at least one metal. In one specific embodiment, the crucible comprises at least one of molybdenum, tantalum, niobium, iridium, platinum, palladium, gold, silver, or tungsten. In another specific embodiment, the crucible comprises at least one of alumina, magnesia, calcia, zirconia, yttria, aluminum nitride or gallium nitride. The crucible may comprise a sintered or other polycrystalline material.

The seed rack provides a convenient means for transferring the seed crystals or plates into the high pressure apparatus, for permitting facile fluid communication between the seed crystals or plates and the nutrient region on the other side of the baffle, and for removing the grown crystals from the reactor at the conclusion of a growth run. The seed rack should be easy to load and unload, enable efficient usage of the available crystal growth volume, and minimize breakage and other yield losses of the crystals.

In preferred embodiments, the seed crystals or plates comprise gallium nitride. In other embodiments, the seed crystals or plates may comprise aluminum nitride, sapphire, silicon carbide, MgAl$_2$O$_4$ spinel, zinc oxide, or the like.

Gallium nitride is a hexagonal, wurtzite-structure crystal (space group P6$_3$mc; point group 6 mm) with distinct growth sectors. Under a given set of growth conditions, growth will occur at different rates in the +c direction, the −c direction, the m directions, the a directions, and in other crystallographic directions. In general, fast-growing directions will tend to grow themselves out of existence, so that the resulting crystals are terminated mainly by facets associated with the slower-growing directions. Manufacturing efficiency is enhanced by using seed crystals or plates that are already large in a relatively slow-growing dimension, and performing the predominant crystal growth in a relatively faster growing direction.

In addition, the tendency for impurity uptake will differ from one growth sector to another. For example, as shown by Frayssinet and co-workers, writing in the Journal of Crystal Growth, volume 230, pages 442-447 (2001), the concentration of free carriers, caused by point defects, is markedly different in the +c and −c growth sectors of unintentionally-doped bulk GaN crystals grown by a particular technique. Similar results have been reported by many other authors, with the general tendency that the (000−1), or −c, growth sector incorporates a higher impurity concentration than does the (0001), or +c, growth sector. Differential impurity uptake is undesirable for at least two reasons. First, the presence of concentration gradients within crystals makes it more difficult for the crystal manufacturer to maintain consistent product specifications. Second, the presence of concentration gradients within the crystal generates strain (typically, impurities in GaN cause a slight increase in the lattice constants), which can lead to bow, cracking, dislocation generation, and other detrimental effects. Manufacturing efficiency, including yield, product quality, and product consistency, is enhanced by restricting the predominant crystal growth to occur in only one growth sector.

In one set of embodiments, manufacturing growth is desired to occur predominantly on m planes. For example, under a predetermined set of growth conditions crystal growth may occur more rapidly in the a direction than in the m direction, and more rapidly in the m direction than in the +c or −c directions. Under such a predetermined set of growth conditions, spontaneously nucleated and grown crystals will take the shape of hexagonal platelets, with large c facets and long m-plane-terminated side edges and a thickness that is less than the diameter. Growth in the m direction could also be preferred by virtue of improved crystallographic quality, reduced impurity incorporation, or, conversely, by increased capability for incorporation of dopants or band-gap modifiers such as Al or In. Growth in the m direction may also be ideal for producing m-plane-oriented wafers. Opposite faces on an m-plane oriented seed crystal or plate will both constitute m planes, so use of such a seed crystal would produce growth in a single crystallographic growth sector.

In one set of embodiments, the seed crystals are attached to the seed rack as shown schematically in FIGS. 2a, 2b, and 2c. Individual seed crystals may be selected or cut to have approximately the same height, so that multiple seed crystals may be placed adjacent to one another in a tier of the seed rack. The seed crystals may have rectangular large-area faces. The seed crystals may be placed between upper and lower seed rack bars and held in place by means of clips. The clips may clamp the seed crystals by spring force, by virtue of the seed crystal being thicker than the separation between opposite sides of the clip when the latter is free standing and relaxed. In an alternative set of embodiments, the seed crystal is affixed to the clip by virtue of a fastener positioned proximate to the clip, seed crystal, and seed rack, such as a length of threaded rod with nuts on opposite ends. In yet another set of embodiments the clips are attached to the seed crystals first and then attached to the seed rack. In some embodiments, the clips have at least one opening through which the crystal can grow, so as to minimize strain and defect generation. In still another set of embodiments, the seed rack comprises recesses, slots, hollows, or the like, into which opposite ends of the seed crystals are slid. Pieces of foil may be placed between the seed crystals and the recesses in the seed rack so as to facilitate removal after crystal growth. In preferred embodiments, each seed crystal is attached to the seed rack in at least two positions, so as to minimize the likelihood of seed or crystal breakage before, during, or after crystal growth, and to hold the seed crystals accurately in the desired positions in the reactor. Adjacent seed crystals or plates may be separated by a crystal separator plate. The crystal separator plates may have holes that slide over the seed rack bar(s), may have slots that are open on one side so as to slide over the seed rack bar, or the like.

In some embodiments, holes or slots are provided in the seed crystals or plates, and the seed crystals or plates are suspended from the seed rack by at least one wire or foil strip. In some embodiments, the seed crystals are suspended by at least two wires or foil strips. The holes or slots in the seed crystals or plates may be formed by laser drilling or cutting, by ultrasonic drilling, by mechanical drilling or milling, by grinding, by sanding, by electric discharge machining, by water jet cutting, or the like.

In one set of embodiments, manufacturing growth is desired to occur predominantly on a planes. Growth in the a direction may provide a useful means for preparing semi-polar substrate orientations. Growth in the a direction could also be preferred by virtue of improved crystallographic quality, reduced impurity incorporation, or, conversely, by increased capability for incorporation of dopants or band-gap modifiers such as Al or In. Opposite faces on an a-plane oriented seed crystal or plate will both constitute a planes, so use of such a seed crystal would produce growth in a single crystallographic growth sector.

In another set of embodiments, manufacturing growth is desired to occur predominantly on c planes, either in the +c or −c direction. For example, under a predetermined set of growth conditions crystal growth may occur more rapidly in the +c or −c direction than in the m direction. Under such a predetermined set of growth conditions, spontaneously nucleated and grown crystals will take the shape of hexagonal pillars, prisms, or needles, with small c facets and long m-plane-terminated side edges and a length that is greater than the diameter. Growth in the +c or −c direction could also be preferred by virtue of improved crystallographic quality, reduced impurity incorporation, or, conversely, by increased capability for incorporation of dopants or band-gap modifiers such as Al or In. Growth in the +c or −c direction may also be ideal for producing c-plane-oriented wafers. Opposite faces on an c-plane oriented seed crystal or plate constitute different planes, so use of such a seed crystal alone would produce growth in two distinct crystallographic growth sectors. Growth in a single crystallographic growth sector may be achieved by stacking pairs of c-plane-oriented seed crystals or plates back to back, with like faces facing one another. For example, the −c face of two c-plane-oriented seed crystals or plates could be faced proximate to one another, so that the +c faces of the two c-plane-oriented seed crystals or plates face outward and would yield growth in a single crystallographic orientation. Conversely, the +c face of two c-plane-oriented seed crystals or plates could be faced proximate to one another, so that the −c faces of the two c-plane-oriented seed crystals or plates face outward and would yield growth in a single crystallographic orientation. The pairs of seed crystals could be placed in direct contact with one another or could be separated by a crystal separator plate. If the pairs of seed crystals or plates grew together during a growth run they could be separated after the run, if desired, or could be left together for use as a seed (bi-)crystal in a subsequent run. A c-plane-oriented bi-crystal, on which both large-area faces constitute +c or −c facets, is suitable for use as a seed, as growth on the large area faces will occur in only a single crystallographic direction.

In still another set of embodiments, manufacturing growth is desired to occur predominantly on semi-polar planes. Semipolar planes may be designated by (hkil Miller indices, where i=−(h+k), l is nonzero and at least one of h and k are nonzero. For example, growth on (1 0−1−1) planes may be preferred over growth on (1 0−1 1) planes because of a higher growth rate, improved crystallographic quality, reduced impurity incorporation, or, conversely, by increased capability for incorporation of dopants or band-gap modifiers such as Al or In. Growth in semipolar directions may be ideal for producing semi-polar-oriented wafers. Opposite faces on a semi-polar oriented seed crystal or plate constitute different planes, so use of such a seed crystal alone would produce growth in two distinct crystallographic growth sectors. Growth in a single crystallographic growth sector may be achieved by stacking pairs of semi-polar-oriented seed crystals or plates back to back, with like faces facing one another. For example, the (1 0−1 1) face of two semi-polar seed crystals or plates could be faced proximate to one another, so that the (1 0−1−1) faces of the two seed crystals or plates face outward and would yield growth in a single crystallographic orientation. More generally, the (h k i l) face of two semipolar seed crystals or plates could be placed proximate to one another, so that the (h k i−l) faces of the two seed crystals or plates face outward and would yield growth in a single crystallographic orientation. The pairs of seed crystals could be placed in direct contact with one another or could be separated by a crystal separator plate. If the pairs of seed crystals or plates grew together during a growth run they could be separated after the run, if desired, or could be left together for use as a seed (bi-)crystal in a subsequent run. A semi-polar bi-crystal, on which both large-area faces constitute the same semi-polar orientation, is suitable for use as a seed, as growth on the large area faces will occur in only a single crystallographic direction.

In some embodiments, the seed crystals or plates have a rectangular or approximately rectangular shape. In some embodiments, the corners of the seed crystals or plates are rounded or chamfered so as to minimize the likelihood of breakage. Rectangular shapes are convenient for mounting and for efficiently utilizing space within the high pressure crystal growth reactor. In other embodiments, the seed crystals or plates have a hexagonal or approximately hexagonal shape. A hexagonal shape may be particularly convenient when working with c-plane-oriented seed crystals or plates. In still other embodiments, the seed crystals or plates have a circular, oval, or approximately circular or oval shape.

In some embodiments, particularly those with non-rectangular seed crystals or plates, the seeds may be arranged in a non-rectangular, close-packed way, as shown in FIG. 2c. Rather than comprising linear arrays of bars arranged into multiple tiers stacked vertically, the seed rack may comprise a honeycomb-type arrangement, with hexagonal, circular, or other shape cutouts arranged in a regular pattern. The honeycomb structure may be formed from a sheet by wire electric discharge machining, water-jet cutting, milling, drilling, or the like. Alternatively, the honeycomb structure may be fabricated from bent quasi-horizontal bars attached with vertical reinforcement structures.

In some embodiments, particularly those involving the use of an autoclave as the high pressure apparatus, the frame further comprises a set of stacked disks or baffles on the top end of the frame. The stacked disks or baffles reduce convective heat transfer from the supercritical fluid during crystal growth to the upper end of the autoclave so that the seal of the autoclave may be at a reduced temperature relative to the upper end of the interior of the autoclave. In other embodiments, one or more disks or baffles are placed on top of the frame after insertion of the latter into a high pressure apparatus.

After loading the frame with seed crystals and raw material, the frame is placed inside a high pressure apparatus or a capsule. At least one mineralizer may be added. The mineralizer may comprise an alkali metal such as Li, Na, K, Rb, or Cs, an alkaline earth metal, such as Mg, Ca, Sr, or Ba, or an alkali or alkaline earth hydride, amide, imide, amido-imide, nitride, or azide. The mineralizer may comprise an ammonium halide, such as $NH_4F$, $NH_4Cl$, $NH_4Br$, or $NH_4I$, a gallium halide, such as $GaF_3$, $GaCl_3$, $GaBr_3$, $GaI_3$, or any compound that may be formed by reaction of one or more of HF, HCl, HBr, HI, Ga, and $NH_3$. The mineralizer may comprise other alkali, alkaline earth, or ammonium salts, other halides, urea, sulfur or a sulfide salt, or phosphorus or a phosphorus-containing salt. The mineralizer may be provided as a loose powder, as granules, or as at least one densified compact or pill. The mineralizer may be added to the raw material basket, may be placed in a crucible, or may be placed directly in the high pressure apparatus or capsule. In a preferred embodiment, the mineralizer is added to the high pressure apparatus or capsule in the absence of exposure to air, such as inside a glove box.

The high pressure apparatus or capsule is then closed and sealed except for a connection to a gas, liquid, or vacuum manifold. In one embodiment, the high pressure apparatus comprises an autoclave, as discussed by U.S. Pat. No. 7,335,262, which is hereby incorporated by reference in its entirety. In another embodiment, the capsule comprises a metal can, as discussed by U.S. Pat. No. 7,125,453, a container, as discussed by U.S. Patent Application 2007/0234946, or a capsule, as discussed by U.S. patent application Ser. No. 12/133,365, entitled "Improved capsule for high pressure processing and method of use for supercritical fluids," all of which are hereby incorporated by reference in their entirety. The inner diameter of the autoclave or capsule may be between 1 inch and 2 inches, between 2 inches and 3 inches, between 3 inches and 4 inches, between 4 inches and 6 inches, between 6 inches and 8 inches, between 8 inches and 10 inches, between 10 inches and 12 inches, between 12 inches and 16 inches, between 16 inches and 24 inches, or greater than 24 inches. The clearance between the inner diameter of the autoclave or capsule and the outer diameter of the frame may be between 0.005 inch and 1 inch, or between 0.010 inch and 0.25 inch. The ratio of the inner height of the autoclave or capsule to its inner diameter may be between 1 and 2, between 2 and 4, between 4 and 6, between 6 and 8, between 8 and 10, between 10 and 12, between 12 and 15, between 15 and 20, or greater than 20.

In some embodiments, the high pressure or capsule is evacuated, so as to remove air, moisture, and other volatile contaminants. In some embodiments, the high pressure apparatus or capsule is heated during evacuation, to a temperature between about 25 degrees Celsius and about 500 degrees Celsius. In some embodiments, the high pressure heater apparatus or capsule are heated using the same heating elements that are used during high pressure processing. In one specific embodiment, the capsule is heated by placing it inside an internally-heated pressure apparatus and heated using the heater for the latter.

In another set of embodiments, the high pressure apparatus or capsule containing the filled frame is purged to remove air, moisture, and other volatile contaminants, as described in U.S. patent application Ser. Nos. 12/133,365 and U.S. Provisional Ser. No. 61/087,122, each of which is commonly assigned, and hereby incorporated by reference herein.

In one specific embodiment, the high pressure apparatus or capsule containing the filled frame is filled with ammonia at elevated pressure and then sealed, as described in U.S. patent application Ser. Nos. 12/133,365 and U.S. Provisional Ser. No. 61/087,122, each of which is commonly assigned, and hereby incorporated by reference herein.

In some embodiments, the autoclave is then heated to crystal growth conditions. In other embodiments, the capsule is placed inside an autoclave, an internally-heated pressure apparatus, or other high pressure apparatus, and heated to crystal growth conditions. In some embodiments, the thermal cycle includes a pre-reaction segment to form mineralizer, polycrystalline gallium nitride, dissolved gallium containing complexes, or the like. In some embodiments, the atmosphere in the autoclave may be modified during the run. For example, excess $H_2$ formed by reaction of gallium metal with ammonia may be bled off through the gate valve or allowed to diffuse through a heated palladium membrane. Excess nitrogen formed by decomposition of an azide mineralizer may be bled off through the gate valve. Additional ammonia may be added to replenish the solvent in the high pressure apparatus.

Suitable thermal cycles for crystal growth are discussed by U.S. Pat. Nos. 6,656,615 and 7,078,731, which are hereby incorporated by reference in their entirety. The crystals grow predominantly perpendicular to the large-diameter faces, but may also grow somewhat in lateral directions as well. With the possible exception of c-plane seeds stacked back-to-back, the crystals are prevented from growing into one another by the crystal separator plates.

After cooling, the frame is removed from the autoclave or capsule, and the grown crystals are removed from the seed rack. If necessary, portions of the clips that have been overgrown by crystalline material may be removed by etching in an appropriate acid, such as at least one of hydrochloric acid, sulfuric acid, nitric acid, and hydrofluoric acid.

The crystals are then sliced into pre-selected orientations. The orientations may comprise the polar (0 0 0 1) c-plane, the non-polar (1–1 0 0) m-plane or (1 1–2 0) a-plane, or semipolar planes, such as (1 1–2±2), (2 0–2±1), (1–1 0±1), (1–1 0±2), and (1–1 0±3) or, more generally, (h k i l), where i=−(h+k), l is nonzero and at least one of h and k are nonzero. After slicing, the crystal wafers may be lapped, polished, and chemical-mechanically polished by methods that are known in the art.

The crystal wafers are useful as substrates for fabrication into optoelectronic and electronic devices such as at least one of a light emitting diode, a laser diode, a photodetector, an avalanche photodiode, a transistor, a rectifier, and a thyristor, one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascade switch, an inner sub-band emitter, a quantum well infrared photodetector, a quantum dot infrared photodetector, a solar cell, and a diode for photoelectrochemical water splitting and hydrogen generation.

In a specific embodiment, any of the above sequence of steps provides a method according to an embodiment of the present invention. In a specific embodiment, the present invention provides a method and resulting crystalline material provided by a pressure apparatus having a seed rack structure. Other alternatives can also be provided where steps are added, one or more steps are removed, or one or more steps are provided in a different sequence without departing from the scope of the claims herein.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A process for growing a crystalline gallium-containing nitride material using one or more seed racks, the process comprising:
   providing an autoclave or capsule comprising:
      a nutrient zone comprising a gallium-containing feedstock;
      a crystal growing zone comprising one or more seed racks, wherein the one or more seed racks comprise multiple bars and multiple tiers; and
      at least one seed crystal attached to the one or more seed racks in at least two positions;
   introducing a solvent capable of forming a supercritical fluid into at least one of the nutrient zone and the crystal growing zone;
   processing one or more portions of the gallium-containing feedstock in the supercritical fluid to provide a supercritical solution comprising at least one gallium containing species at a first temperature; and
   growing a crystalline gallium-containing nitride material from the supercritical solution on the seed crystal at a second temperature, the second temperature being characterized to cause the at least one gallium containing species to form the crystalline gallium-containing nitride material on the seed crystal.

2. The process of claim 1, wherein the one or more seed racks comprise at least one of gold, silver, palladium, platinum, iridium, ruthenium, rhodium, titanium, vanadium, chromium, iron, nickel, zirconium, niobium, molybdenum, tantalum, tungsten, and rhenium.

3. The process of claim 1, wherein the one or more seed racks comprise at least one of round bar stock, rectangular bar stock, threaded rod, and fasteners.

4. The process of claim 3, further comprising clips for attaching the at least one seed crystal to the one or more seed racks.

5. The process of claim 4, wherein the at least one seed crystal is attached by means of at least two clips.

6. The process of claim 1, wherein the one or more seed racks comprise slots into which at least two edges of the at least one seed crystal are placed.

7. The process of claim 1, wherein the one or more seed racks comprise a honeycomb structure, with at least one opening with a hexagonal or a circular cross section.

8. The process of claim 1, wherein the autoclave or capsule has an inner diameter greater than 50 mm.

9. The process of claim 8, wherein the autoclave or capsule has an inner diameter greater than 75 mm.

10. The process of claim 9, wherein the autoclave or capsule has an inner diameter greater than 100 mm.

11. The process of claim 10, wherein the autoclave or capsule has an inner diameter greater than 150 mm.

12. The process of claim 11, wherein the autoclave or capsule has an inner diameter greater than 200 mm.

13. The process of claim 1, wherein at least one of a baffle and a basket are coupled to the one or more seed racks.

14. The process of claim 1, wherein the crystal growing zone is characterized by a first volume, the nutrient zone is characterized by a second volume, and a ratio of the first volume to the second volume is between about 1 and about 5.

15. The process of claim 1, wherein the crystal growing zone is characterized by a first volume, the nutrient zone is characterized by a second volume, and a ratio of the first volume to the second volume is between about 1.25 and about 3.

16. The process of claim 1, wherein the multiple tiers are stacked vertically.

17. The process of claim 1, wherein the surface area of the gallium-containing feedstock is characterized by a surface area at least three times greater than a total surface area of the at least one seed crystal.

18. The process of claim 1, further comprising slicing the crystalline gallium-containing nitride material into one or more crystal wafers.

19. The process of claim 18, further comprising fabricating an optoelectronic or an electronic device on the one or more crystal wafers, wherein the optoelectronic or electronic device is selected from a light emitting diode, a laser diode, a photodetector, an avalanche photodiode, a transistor, a rectifier, and a thyristor, one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascade switch, an inner sub-band emitter, a quantum well infrared photodetector, a quantum dot infrared photodetector, a solar cell, a diode for photoelectrochemical water splitting and hydrogen generation, and a combination of any of the foregoing.

20. The process of claim 1, wherein the one or more seed racks comprise a material selected from copper, copper-based alloy, gold, gold-based alloy, silver, silver-based alloy, palladium, platinum, iridium, ruthenium, rhodium, osmium, titanium, vanadium, chromium, iron, iron-based alloy, nickel, nickel-based alloy, zirconium, niobium, molybdenum, tantalum, tungsten, rhenium, silica, alumina, and a combination of any of the foregoing.

21. The process of claim 1, wherein the one or more seed racks are chemically inert under crystal growth conditions.

* * * * *